United States Patent
Tanabe et al.

(10) Patent No.: US 10,198,139 B2
(45) Date of Patent: Feb. 5, 2019

(54) METHOD OF PRODUCING TOUCH SENSOR MEMBER, AND TOUCH SENSOR MEMBER

(71) Applicant: Toray Industries, Inc., Tokyo (JP)

(72) Inventors: Miharu Tanabe, Otsu (JP); Akihiko Tanaka, Otsu (JP)

(73) Assignee: Toray Industries, Inc. (JP)

( * ) Notice: Subject to any disclaimer, the term of this patent is extended or adjusted under 35 U.S.C. 154(b) by 16 days.

(21) Appl. No.: 15/102,621

(22) PCT Filed: Dec. 9, 2014

(86) PCT No.: PCT/JP2014/082513
§ 371 (c)(1),
(2) Date: Jun. 8, 2016

(87) PCT Pub. No.: WO2015/087859
PCT Pub. Date: Jun. 18, 2015

(65) Prior Publication Data
US 2016/0313833 A1   Oct. 27, 2016

(30) Foreign Application Priority Data

Dec. 12, 2013 (JP) .................................. 2013-256645
Mar. 14, 2014 (JP) .................................. 2014-051262

(51) Int. Cl.
| | | |
|---|---|---|
| *G06F 3/044* | (2006.01) | |
| *G01R 27/26* | (2006.01) | |
| *G06F 3/047* | (2006.01) | |
| *G06F 3/041* | (2006.01) | |
| *G03F 7/00* | (2006.01) | |
| *G03F 7/20* | (2006.01) | |
| *G03F 7/32* | (2006.01) | |
| *G03F 7/40* | (2006.01) | |

(52) U.S. Cl.
CPC .......... *G06F 3/047* (2013.01); *G03F 7/0005* (2013.01); *G03F 7/20* (2013.01); *G03F 7/32* (2013.01); *G03F 7/40* (2013.01); *G06F 3/041* (2013.01); *G06F 3/044* (2013.01); *G06F 3/0416* (2013.01); *G06F 3/0418* (2013.01); *G06F 2203/04103* (2013.01)

(58) Field of Classification Search
CPC ....... G06F 3/044; G06F 3/0412; G06F 3/0416
See application file for complete search history.

(56) References Cited

U.S. PATENT DOCUMENTS

2012/0118614 A1* 5/2012 Kuriki .................... G06F 3/044
                                                                174/250
2013/0292162 A1* 11/2013 Lee ........................ H05K 3/10
                                                                174/257

FOREIGN PATENT DOCUMENTS

| JP | 2004266142 A | * | 9/2004 |
| JP | 2013-924 A | | 1/2013 |
| JP | 2013-206050 A | | 10/2013 |
| JP | 2013206050 A | * | 10/2013 |
| JP | 2013-246723 A | | 12/2013 |

* cited by examiner

*Primary Examiner* — Nan-Ying Yang
(74) *Attorney, Agent, or Firm* — DLA Piper LLP (US)

(57) ABSTRACT

A touch sensor member includes a substrate sectioned into a display region and a design region; a conductive pattern formed on the display region and having a line width of 2 to 6 μm; and a conductive pattern formed on the design region and having a line width of 7 to 100 μm, wherein the conductive pattern having a line width of 2 to 6 μm and the conductive pattern having a line width of 7 to 100 μm have the same composition.

8 Claims, No Drawings

METHOD OF PRODUCING TOUCH SENSOR MEMBER, AND TOUCH SENSOR MEMBER

TECHNICAL FIELD

This disclosure relates to a method of producing a touch sensor member, and a touch sensor member.

BACKGROUND

Touch panels commonly incorporated in devices such as mobile telephones and personal digital assistants (PDAs) are broadly classified into display devices such as liquid crystal panels and position input devices such as touch sensors. The touch sensor includes a detection electrode formed principally in a display region, and conductive wiring disposed in a design region on the periphery of the display region. For the detection electrode, indium tin oxide (hereinafter, referred to as "ITO") having high transparency is widely used so that visual recognizability of a display section is not hindered.

However, indium as a raw material of ITO is an expensive rare earth metal and supply thereof is unstable. Further, ITO has relatively low conductivity, and therefore has the problem that conductivity is too low for use as a detection electrode of a large touch panel that is incorporated in an electronic blackboard. In view of these situations, a replacement for ITO has been searched for and, for example, a material including a noble metal (Japanese Patent Laid-open Publication No. 2013-924) has been developed. However, use of this material in a touch panel causes light reflection specific to a noble metal and associated visibility of a detection electrode, leading to deterioration of visual recognizability of a display section.

Further, there has been the problem that ITO formed in a display region of a touch sensor and conductive wiring disposed in a design region on the periphery of the display region have poor connectivity ascribable to poor adhesion between ITO and a material used in conductive wiring, and a position shift resulting from thermal shrinkage, a chemical solution residual on the surface and physical stimulation due to involvement of various steps such as a heating step and a step of laminating other materials, between a step of forming a pattern of ITO and a step of forming conductive wiring disposed in the design region, and thus failures such as disconnection and poor conduction frequently occur. Accordingly, an entirely novel technique of replacement for ITO has been strongly desired.

Thus, it could be helpful to provide a touch sensor member on which a detection electrode (minute conductive pattern) which functions as a replacement for ITO, causes no problem pertaining to visibility of the detection electrode and light reflection in the display region, inhibits disconnection and poor conduction between the detection electrode and conductive wiring (conductive pattern) in a design region and has excellent conductivity, is formed in the display region. It could also be helpful to provide a method of producing the aforementioned touch sensor member.

SUMMARY

We provide a method of producing a touch sensor member and a touch sensor member as set forth in (1) to (7) below.

(1) A method of producing a touch sensor member, the method including: a conductive coating film formation step of obtaining, in a substrate sectioned into a display region and a design region, a conductive coating film by applying a photosensitive conductive paste onto the display region and the design region; and a conductive pattern formation step of obtaining a conductive pattern by exposing and developing the conductive coating film on the display region and the conductive coating film on the design region at once and then by heating the films at 100 to 250° C. or by irradiating same with light from a xenon flash tube, wherein the line width of the conductive pattern on the display region is between 2 and 6 µm, and the line width of the conductive pattern on the design region is between 7 and 100 µm.

(2) A method of producing a touch sensor member, the method including: a lightproof coating film formation step of obtaining, in a substrate sectioned into a display region and a design region, a lightproof coating film by applying a photosensitive lightproof paste onto the display region; a conductive coating film formation step of obtaining a conductive coating film by applying a photosensitive conductive paste onto the display region and the design region after the lightproof coating film formation step; and a lightproof layer and conductive pattern formation step of obtaining a lightproof layer and a conductive pattern by exposing and developing the lightproof coating film and the conductive coating film on the display region and the conductive coating film on the design region at once and then by heating the films at 100 to 250° C. or by irradiating same with light from a xenon flash tube, wherein the line width of the conductive pattern on the display region is between 2 and 6 µm, and the line width of the conductive pattern on the design region is between 7 and 100 µm.

(3) The method of producing a touch sensor member according to (1) or (2), wherein the conductive coating film on the display region and the conductive coating film on the design region contain the same organic component.

(4) The method of producing a touch sensor member according to any one of (1) to (3), wherein the conductive coating film on the display region and the conductive coating film on the design region have the same composition.

(5) The method of producing a touch sensor member according to (4), wherein in the conductive coating film formation step, a photosensitive conductive paste is applied onto the display region and the design region at once.

(6) A touch sensor member including: a substrate sectioned into a display region and a design region; a conductive pattern formed on the display region and having a line width between 2 and 6 µm; and a conductive pattern formed on the design region and having a line width between 7 and 100 µm, wherein the conductive pattern having a line width between 2 and 6 µm and the conductive pattern having a line width between 7 and 100 µm have the same composition.

(7) The touch sensor member according to (6), including a lightproof layer between the display region and the conductive pattern having a line width between 2 and 6 µm.

With a method of producing a touch sensor member, a minute conductive pattern functioning as a replacement for ITO and causing no problem pertaining to visibility of the detection electrode and light reflection in a display region can be formed on the display region of the touch sensor, and further, conductive wiring inhibiting disconnection and poor conduction and having very good connectivity can be formed on a design region at once in parallel to formation of the conductive pattern. Productivity can be improved by forming the conductive pattern and the conductive wiring at once.

DETAILED DESCRIPTION

A method of producing a touch sensor member in a first aspect includes a conductive coating film formation step of obtaining, in a substrate sectioned into a display region and a design region, a conductive coating film by applying a photosensitive conductive paste onto the display region and the design region; and a conductive pattern formation step of obtaining a conductive pattern comprising a multiplicity of lines by exposing and developing the conductive coating film on the display region and the conductive coating film on the design region at once and then by heating the films at 100 to 250° C. or by irradiating same with light from a xenon flash tube, wherein the line width of the lines in the conductive pattern on the display region is 2 to 6 µm, and the line width of the lines in the conductive pattern on the design region is 7 to 100 µm.

Examples of the substrate to be coated with a photosensitive conductive paste in the conductive coating film formation step include films such as polyethylene terephthalate films (hereinafter, referred to as "PET films"), polyimide films, polyester films and aramid films, epoxy resin substrates, polyether imide resin substrates, polyether ketone resin substrates, polysulfone-based resin substrates, glass substrates such as alkali glass substrates, non-alkali glass substrates and glass-epoxy resin composite substrates, silicon wafers, alumina substrates, aluminum nitride substrates and silicon carbide substrates, with films and glass substrates being preferred. The surfaces of the substrates may be covered with an insulating layer, a pattern or a design layer. The glass of the glass substrates is preferably a reinforced glass subjected to a reinforcement treatment. The reinforced glass is, for example, a chemically reinforced glass with compressive stress generated on a glass surface layer by ion-exchanging molecules in the glass surface layer to form large molecules on the glass surface, or a physically reinforced glass with compressive stress generated on a glass surface layer by heating a glass to a temperature at which residual stress remains, and then rapidly cooling the glass.

The substrate may be a continuous long substrate. When the substrate is a long substrate, a pattern can be produced using, for example, a reel-to-reel method or a roll-to-roll method. The use of a method such as a roll-to-roll method is efficient because a plurality of lines can be obtained at a time when with irradiation light at the center, substrates are arranged side by side in the front and the rear thereof.

The design region of the substrate refers to a region corresponding to a frame portion in the touch sensor. A design layer composed of a white, black or other color resin may be formed in the design layer of the substrate, and a surface of the design layer may be covered with a metal thin film of molybdenum or the like. An insulating layer composed of a transparent resin or the like may be formed in the display region and/or design region of the substrate. When a design layer is formed in the design region, a step difference is generated at the boundary between the design region and the display region, and therefore it is preferred that an insulating layer is provided in the design region and the display region at once because the uppermost surface becomes even so that disconnection of the conductive pattern due to a step difference can be inhibited.

A method of obtaining a conductive coating film by applying a photosensitive conductive paste onto the substrate can be selected according to the viscosity of the paste. Examples of the method include spin coating by a spinner, spray coating, roll coating, screen printing, offset printing, gravure printing, letterpress printing, flexographic printing, and methods of coating by a blade coater, a die coater, a calender coater, a meniscus coater or a bar coater. Among them, screen printing is preferred because the surface of the resulting conductive coating film has satisfactory smoothness, and thickness adjustment by selection of a screen printing plate is easy.

The photosensitive conductive paste to be applied onto the substrate refers to a composition containing conductive particles, a photosensitive organic compound as an organic component, and a solvent. The ratio of conductive particles to the total solid content in the photosensitive conductive paste is preferably 60 to 95% by mass, more preferably 80 to 90% by mass. When the above-mentioned ratio is 60% by mass or more, the contact probability between conductive particles increases, and the resistivity and the disconnection probability of the resulting conductive pattern decrease. The reason why the disconnection probability decreases is that the rate of very small defects generated by isolating conductive particles in the conductive pattern by organic components and bubbles decreases. On the other hand, when the above-mentioned ratio is 95% by mass or less, a minute pattern can be easily formed because light for exposure smoothly passes through the conductive coating film. The total solid content refers to all constituents of the photosensitive conductive paste or the photosensitive lightproof paste excluding the solvent.

Examples of the conductive particles contained in the photosensitive conductive paste include particles of metals such as silver (Ag), gold (Au), copper (Cu), platinum (Pt), lead (Pb), tin (Sn), nickel (Ni), aluminum (Al), tungsten (W), molybdenum (Mo), chromium (Cr), titanium (Ti), and indium (In) or alloys of these metals, and metal oxides such as ruthenium oxide. Particles of Ag, Cu and Au are preferred from the viewpoint of conductivity, and particles of Ag are more preferred from the viewpoint of a low cost and stability.

When particles of Ag are used as conductive particles, light reflection by Ag easily occurs after formation of a conductive pattern, and therefore it is preferred that the conductive pattern contains an organic component together with particles of Ag. Direct light reflection by Ag can be suppressed by an organic component.

The conductive particle may have a layer structure of two or more layers. The conductive particle may have a structure including Cu as a core, and Ag as a shell on the surface. The conductive particle may contain various organic components on the surface. The organic components on the surface can be effectively used because they function to maintain the dispersibility of conductive particles having a small particle size, and function as a conductive aid. Examples of the organic component include fatty acid, amine and thiol-based organic compounds, and carbon.

The photosensitive organic compound contained in the photosensitive conductive paste refers to a monomer, an oligomer or a polymer which contains an unsaturated double bond. Examples of the monomer containing an unsaturated double bond include acryl-based monomers. Examples of the acryl-based monomer include acryl-based monomers such as methyl acrylate, acrylic acid, 2-ethylhexyl acrylate, ethyl methacrylate, n-butyl acrylate, iso-butyl acrylate, isopropane acrylate, glycidyl acrylate, N-methoxymethyl acryl amide, N-ethoxymethyl acryl amide, N-n-butoxymethyl acryl amide, N-isobutoxymethylacrylamide, butoxy triethylene glycol acrylate, dicyclopentanyl acrylate, dicyclopentenyl acrylate, 2-hydroxyethyl acrylate, isobornyl acrylate, 2-hydroxypropyl acrylate, isodexyl acrylate, isooctyl acrylate, lauryl acrylate, 2-methoxyethyl acrylate, methoxyethylene glycol acrylate, methoxydiethylene glycol acrylate, octafluoropentyl acrylate, phenoxyethyl acrylate, stearyl acrylate, trifluoroethyl acrylate, acrylamide, aminoethyl acrylate, phenyl acrylate, phenoxyethyl acrylate, 1-naphthyl acrylate, 2-naphthyl acrylate, thiophenol acrylate and benzylmercaptan acrylate; styrenes such as styrene, p-methyl styrene, o-methyl styrene, m-methyl styrene, α-methyl styrene, chloromethyl styrene and hydroxymethyl styrene; γ-methacryloxypropyltrimethoxysilane; 1-vinyl-2-pyrrolidone; allylated cyclohexyl diacrylate; 1,4-butanediol diacrylate; 1,3-butylene glycol diacrylate; ethylene glycol diacrylate; diethylene glycol diacrylate; triethylene glycol diacrylate; polyethylene glycol diacrylate; dipentaerythritol hexaacrylate; dipentaerythritol monohydroxypentaacrylate; ditrimethylolpropane tetraacrylate; glycerol diacrylate; methoxylated cyclohexyl diacrylate; neopentylglycol diacrylate; propylene glycol diacrylate; polypropylene glycol diacrylate; triglycerol diacrylate; trimethylolpropane triacrylate; and epoxy acrylate monomers such as acrylic acid adducts of ethylene glycol diglycidyl ether, acrylic acid adducts of diethylene glycol diglycidyl ether, acrylic acid adducts of neopentyl glycol diglycidyl ether, acrylic acid adducts of glycerin diglycidyl ether, acrylic acid adducts of bisphenol A diglycidyl ether, acrylic acid adducts of bisphenol F and acrylic acid adducts of cresol novolac each having a hydroxyl group formed by ring-opening an epoxy group with an unsaturated acid. Examples of the epoxy acrylate monomer include Epoxy Esters 40EM, 70PA, 80MFA and 3002M (each manufactured by KYOEISHA CHEMICAL Co., LTD.), CN104 and CN121 (each manufactured by Sartomer company, Inc.), EBECRYL3702, EBECRYL3700 and EBECRYL600 (each manufactured by DAICEL-CYTEC Co Ltd.). Further, examples of the epoxy acrylate monomer include compounds in which the acrylic group of the acryl-based monomer is replaced by a methacrylic group.

Examples of the polymer containing an unsaturated double bond include acryl-based copolymers. The acryl-based copolymer refers to a copolymer containing an acryl-based monomer as a copolymer component. Preferably, the polymer has a carboxyl group. The acryl-based copolymer having a carboxyl group is obtained by using as a monomer an unsaturated acid such as an unsaturated carboxylic acid. Examples of the unsaturated acid include acrylic acid, methacrylic acid, itaconic acid, crotonic acid, maleic acid, fumaric acid, vinyl acetate, and acid anhydrides of these acids. The acid value of the resulting acryl-based copolymer can be adjusted by increasing or decreasing the amount of an unsaturated acid to be used.

By reacting carboxyl groups of the acryl-based copolymer with a compound containing an unsaturated double bond such as glycidyl (meth)acrylate, an alkali-soluble acryl-based copolymer containing a reactive unsaturated double bond on the side chain is obtained.

The acid value of the photosensitive organic compound is preferably 40 to 250 mg KOH/g to ensure that the photosensitive organic compound has optimum alkali-solubility. The solubility of the soluble moiety decreases when the acid value is less than 40 mg KOH/g. On the other hand, when the acid value is more than 250 mg KOH/g, the development allowance range is narrowed. The acid value can be measured in accordance with JIS K 0070 (1992).

The photosensitive conductive paste may contain a thermosetting compound. The thermosetting compound refers to a monomer, oligomer or polymer having an epoxy group, a phenol resin, a polyimide precursor or a ring-closed polyimide, and a monomer, oligomer or polymer having an epoxy group is preferred.

Examples of the polymer having an epoxy group include ethylene glycol-modified epoxy resins, bisphenol A-type epoxy resins, brominated epoxy resins, bisphenol F-type epoxy resins, novolac-type epoxy resins, cycloaliphatic epoxy resins, glycidylamine-type epoxy resins, glycidyl ether-type epoxy resins and heterocyclic epoxy resins.

The added amount of the thermosetting compound is preferably 1 to 100 parts by mass, more preferably 30 to 80 parts by mass, further preferably 10 to 80 parts by mass based on 100 parts by mass of the photosensitive organic compound. Adhesion is improved when the added amount of the thermosetting compound is 30 parts by mass or more based on 100 parts by mass of the photosensitive organic compound. On the other hand, when the added amount of the thermosetting compound is 80 parts by mass or less based on 100 parts by mass of the photosensitive organic compound, a photosensitive conductive paste having high stability when it is in the form of a coating film can be obtained.

The photosensitive organic compound and the thermosetting compound have preferably a cycloaliphatic structure, more preferably a cyclohexane backbone for retaining the shape of a conductive coating film during heating or irradiation of light from a xenon flash tube. The cycloaliphatic structure refers to a structure in which carbon atoms are united to form a ring, except for an aromatic ring. Examples of the cycloaliphatic structure include cyclopropane backbones, cyclobutane backbones, cyclopentane backbones, cyclohexane backbones, cyclobutene backbones, cyclopentene backbones, cyclohexene backbones, cyclopropyne backbones, cyclobutyne backbones, cyclopentyne backbones, cyclohexyne backbones and hydrogenated bisphenol A backbones.

Examples of the compound to be used for synthesis of a photosensitive organic compound or thermosetting compound having the above-mentioned backbone include hydrogenated bisphenol A, 1,1-cyclobutanedicarboxylic acid, 1,2,3,4-cycl obutanetetracarboxylic acid, 4,4-diamino-dicyclohexylmethane, isophorone diamine, dicyclohexylmethane 4,4'-diisocyanate, trans-4-methylcyclohexylisocyanate, TAKENATE 600 (1,3-bis(isocyanatemethyl)cyclohexane) (manufactured by Mitsui Chemicals, Inc.), isophorone diisocyanate, 1,2-epoxycyclohexane, 1-vinyl-3,4-epoxycyclohexane, RIKARESIN DME-100 (1,4-cyclohexanedimethanol diglycidyl ether) (manufactured by New Japan Chemical co., ltd.), RIKARESIN HBE-100 (polymer of 4 4'-isopropylidenedicyclohexanol and (chloromethyl) oxirane) (manufactured by New Japan Chemical co., ltd.), ST-4000D (epoxy resin mainly composed of hydrogenated bisphenol A; manufactured by Nippon Steel Chemical Co., Ltd.), 1,2:5,6-diepoxycyclooctane, PO adduct diacrylates of hydrogenated bisphenol A, EO adduct dimethacrylates of hydrogenated bisphenol A, PO adduct dimethacrylates of hydrogenated bisphenol A, 2-acryloyloxyethylhexahydrophthalic acid, dimethylol-tricyclodecane diacrylate, cyclohexyl acrylate, cyclohexyl methacrylate, tert-butylcyclohexyl acrylate, tert-butylcyclohexyl methacrylate, isobornyl acrylate, dicyclopentenyl acrylate, dicyclopentenyloxyethyl acrylate, dicyclopentanyl acrylate, dicyclopentenyloxyethyl methacrylate and dicyclopentanyl methacrylate.

Preferably, the photosensitive conductive paste contains a photopolymerization initiator as necessary. The photopolymerization initiator refers to a compound that generates radicals by absorbing short-wavelength light such as an ultraviolet ray to be decomposed or by undergoing a hydrogen-withdrawing reaction. Examples of the photopolymerization initiator include 1,2-octanedione, [4-(phenylthio)-2-(O-benzoyloxime)], 2,4,6-trimethylbenzoyl-diphenyl-phosphine oxide, bis(2,4,6-trimethylbenzoyl)-phenylphosphine oxide, ethanone, 1-[9-ethyl-6-2(2-methylbenzoyl)-9H-carbazole-3-yl]-1-(O-acetyloxime), benzophenone, methyl o-benzoylbenzoate, 4,4'-bis(dimethylamino)benzophenone, 4,4'-bis(diethylamino)benzophenone, 4,4'-dichlorobenzophenone, 4-benzoyl-4'-methyldiphenylketone, dibenzylketone, fluorenone, 2,2'-diethoxyacetophenone, 2,2-dimethoxy-2-phenylacetophenone, 2-hydroxy-2-methylpropiophenone, p-t-butyl dichloro acetophenone, thioxanthone, 2-methylthioxanthone, 2-chlorothioxanthone, 2-isopropylthioxanthone, diethylthioxanthone, benzyl, benzyldimethyl ketal, benzyl-P-methoxyethyl acetal, benzoin, benzoin methyl ether, benzoin butyl ether, anthraquinone, 2-t-butylanthraquinone, 2-amylanthraquinone, P-chloroanthraquinone, anthrone, benzanthrone, dibenzosuberone, methyleneanthrone, 4-azidebenzalacetophenone, 2,6-bis(p-azidebenzylidene)cyclohexanone, 6-bis(p-azidebenzylidene)-4-methylcyclohexanone, 1-phenyl-1,2-butanedione-2-(o-methoxycarbonyl)oxime, 1-phenyl-propanedione-2-(o-ethoxycarbonyl)oxime, 1-phenyl-propanedione-2-(o-benzoyl)oxime, 1,3-diphenyl-propanetrione-2-(o-ethoxycarbonyl)oxime, 1-phenyl-3-ethoxy-propanetrione-2-(o-benzoyl)oxime, Michler's ketone, 2-methyl-[4-(methylthio)phenyl]-2-morpholino-1-propanone, naphthalenesulfonyl chloride, quinolinesulfonyl chloride, N-phenylthioacridone, 4,4'-azobisisobutyronitrile, diphenyl disulfide, benzothiazole disulfide, triphenylphosphine, camphor quinone, 2,4-diethylthioxanthone, isopropylthioxanthone, carbon tetrabromide, tribromophenyl sulfone, benzoyl peroxide, and combinations of a photo-reductive pigment such as eosin and methylene blue, and a reducing agent such as ascorbic acid and triethanolamine.

The added amount of the photopolymerization initiator is preferably 0.05 to 30 parts by mass, more preferably 5 to 20 parts by mass based on 100 parts by mass of the photosensitive organic compound. When the added amount of the photopolymerization initiator is 5 parts by mass or more based on 100 parts by mass of the photosensitive organic compound, the curing density of an exposed part of the photosensitive conductive paste increases so that the residual film ratio after developing increases. On the other hand, when the added amount of the photopolymerization initiator is 30 parts by mass or less based on 100 parts by mass of the photosensitive organic compound, excessive absorption of light at the upper part of a coating film obtained by applying the photosensitive conductive paste is suppressed. As a result, the formed pattern is inhibited from being reversely tapered to suppress reduction in adhesion to the substrate.

The photosensitive conductive paste may contain a sensitizer along with the photopolymerization initiator.

Examples of the sensitizer include 2,4-diethylthioxanthone, isopropylthioxanthone, 2,3-bis(4-diethylaminobenzal)cyclopentanone, 2,6-bis(4-dimethylaminobenzal)cyclohexanone, 2,6-bis(4-dimethylaminobenzal)-4-methylcyclohexanone, Michler's ketone, 4,4-bis(diethylamino)benzophenone, 4,4-bis(dimethylamino) chalcone, 4,4-bis(diethylamino)chalcone, p-dimethylaminocinnamylideneindanone, p-dimethylaminobenzylideneindanone, 2-(p-dimethylaminophenylvinylene)isonaphthothiazole, 1,3-bis(4-dimethylaminophenylvinylene)isonaphthothiazole, 1,3-bis(4-dimethylaminobenzal) acetone, 1,3-carbonylbis(4-diethylaminobenzal)acetone, 3,3-carbonylbis(7-diethylaminocoumarin), N-phenyl-N-ethyl ethanol amine, N-phenylethanolamine, N-tolyldiethanolamine, isoamyldimethylaminobenzoate, isoamyl diethylaminobenzoate, 3-phenyl-5-b enzoylthiotetrazole and 1-phenyl-5-ethoxycarbonylthiotetrazole.

The added amount of the sensitizer is preferably 0.05 to 10 parts by mass, more preferably 0.1 to 10 parts by mass based on 100 parts by mass of the photosensitive organic compound. When the added amount of the sensitizer is 0.1 parts by mass or more based on 100 parts by mass of the photosensitive organic compound, the light sensitivity is sufficiently improved. On the other hand, when the added amount of the sensitizer is 10 parts by mass or less based on 100 parts by mass of the photosensitive organic compound as a photosensitive organic component, excessive absorption of light at the upper part of a coating film obtained by applying the photosensitive conductive paste is suppressed. As a result, the formed pattern is inhibited from being reversely tapered to suppress reduction in adhesion to the substrate.

The photosensitive conductive paste may contain a carboxylic acid or an acid anhydride thereof. Examples of the carboxylic acid include acetic acid, propionic acid, succinic acid, maleic acid, phthalic acid, 1,2,3,6-tetrahydrophthalic acid, 3,4,5,6-tetrahydrophthalic acid, hexahydrophthalic acid, 4-methylhexahydrophthalic acid, methylbicyclo[2.2.1] heptane-2,3-dicarboxylic acid, ethylene glycol bis-anhydrotrimellitate, glycerin-bis-anhydrotrimellitate monoacetate, tetrapropenyl succinic acid, octenyl succinic acid, 3,3',4,4'-diphenylsulfonetetracarboxylic acid, 1,3,3a,4,5,9b-hexahydro-5-(tetrahydro-2,5-dioxo-3-furanyl)naphto[1,2-c]furane-1,3-dione, 1,2,3,4-butanetetracarboxylic acid, cyclohexane-1,2,3,4-tetracarboxylic acid, BYK-P105 (manufactured by BYK-Chemie GmbH), PA-111 (manufactured by Ajinomoto Fine-Techno Co., Inc.), FLOWLEN G-700 and FLOWLEN G-900 (each manufactured by KYOEISHA CHEMICAL Co., LTD.), and KD-4, KD-8, KD-9, KD-12, KD-15 and JP-57 (each manufactured by Croda Company).

Examples of the acid anhydride include acetic anhydride, propionic anhydride, succinic anhydride, maleic anhydride, phthalic anhydride, 1,2,3,6-tetrahydrophthalic anhydride, 3,4,5,6-tetrahydrophthalic anhydride, hexahydrophthalic anhydride, 4-methyl hexahydrophthalic anhydride, methylbicyclo[2.2.1]heptane-2,3-dicarboxylic anhydride, ethylene glycol bis-anhydrotrimellitate, glycerin-bis-anhydrotrimellitate monoacetate, tetrapropenyl succinic anhydride, octenyl succinic anhydride, 3,3',4,4'-diphenylsulfonetetracarboxylic anhydride, 1,3,3a,4,5,9b-hexahydro-5-(tetrahydro-2,5-dioxo-3-furanyl)naphto[1,2-c]furane-1,3-dione, 1,2,3,4-butanetetracarboxylic dianhydride and cyclohexane-1,2,3,4-tetracarboxylic 3,4-anhydride.

The added amount of the carboxylic acid or acid anhydride thereof is preferably 0.5 to 30 parts by mass, more preferably 1 to 20 parts by mass based on 100 parts by mass of the photosensitive organic compound. When the added amount of the carboxylic acid or acid anhydride thereof is 0.5 parts by mass or more based on 100 parts by mass of the photosensitive organic compound, affinity to a developer is improved so that satisfactory patterning is possible. On the other hand, when the added amount of the carboxylic acid or acid anhydride thereof is 30 parts by mass or less based on 100 parts by mass of the photosensitive organic compound, the developing margin and adhesion under a high temperature and high humidity are improved.

Preferably, the photosensitive conductive paste contains a solvent to adjust the viscosity of the photosensitive conductive paste. The solvent may be added at the end in the process of preparing the paste. By increasing the amount of the solvent, the thickness of the conductive film after drying can be reduced. Examples of the solvent include N,N-dimethylacetamide, N,N-dimethylformamide, N-methyl-2-pyrrolidone, dimethyl imidazolidinone, dimethyl sulfoxide, diethylene glycol monoethyl ether, diethylene glycol monoethyl ether acetate (hereinafter, referred to as "DMEA"), diethylene glycol monomethyl ether acetate, γ-butyrolactone, ethyl lactate, 1-methoxy-2-propanol, 1-ethoxy-2-propanol, ethylene glycol mono-n-propyl ether, diacetone alcohol, tetrahydrofurfuryl alcohol, and propylene glycol monomethyl ether acetate. Two or more of these solvents may be mixed.

The photosensitive conductive paste may contain a plasticizer, a leveling agent, a surfactant, a silane coupling agent, an antifoaming agent, a stabilizer and so on as long as desired properties of the photosensitive conductive paste are not impaired.

Examples of the plasticizer include dibutyl phthalate, dioctyl phthalate, polyethylene glycol, and glycerin.

Examples of the leveling agent include special vinyl-based polymers and special acryl-based polymers.

Examples of the silane coupling agent include methyltrimethoxysilane, dimethyl diethoxy silane, phenyltriethoxysilane, hexamethyldisilazane, 3-methacryloxypropyltrimethoxy silane, 3-glycidoxypropyltrimethoxysilane, and vinyltrimethoxysilane.

Examples of the stabilizer include benzotriazole derivatives, benzophenone derivatives, salicylic acid derivatives, cyanoacrylate derivatives, TINUVIN 109, TINUVIN 234, TINUVIN 328, TINUVIN 329, TINUVIN 384-2 and TINUVIN 571 (each manufactured by NAGASE & CO., LTD.), EVERSORB75, EVERSORB76, EVERSORB81, EVERSORB109 and EVERSORB234 (each manufactured by SORT CO., LTD.), ADEKA STAB LA-38 (manufactured by ADEKA CORPORATION), Sumisorb130, Sumisorb250, Sumisorb340 and Sumisorb350 (each manufactured by Sumika Chemtex Co., Ltd.), and compounds having primary to tertiary amino groups. Examples of the compound having primary to tertiary amino groups include N-(2-aminoethyl) piperazine, 1-(2-aminoethyl)-4-methylpiperazine hydrochloride, 6-amino-1-methyluracil, polyethyleneimine, octadecyl isocyanate-modified polyethyleneimine and propylene oxide-modified polyethyleneimine.

When the photosensitive conductive paste is applied by screen printing, the viscosity thereof is preferably 4,000 to 150,000 mPa·s, more preferably 4,000 to 50,000 mPa·s (value measured at 3 rpm using a Brookfield viscometer). A conductive coating film cannot be formed on the substrate when the viscosity is less than 4,000 mPa·s. In this case, it is preferred to use a method such as spin coating by a spinner, spray coating, roll coating, offset printing, gravure printing or die coating. On the other hand, when the viscosity is more than 150,000 mPa·s, irregularities are generated on the surface of the conductive coating film so that exposure unevenness easily occurs. The viscosity of the photosensitive conductive paste can be measured at 3 rpm using a Brookfield viscometer.

The thickness of the resulting conductive coating film may be appropriately determined according to, for example, a coating method, or a total solid concentration or a viscosity of the photosensitive conductive paste, but the thickness after drying is preferably 0.1 to 10 μm. When the thickness is more than 10 μm, light for exposure cannot smoothly pass through the conductive coating film, and thus disconnection or detachment of the resulting conductive pattern occurs, or the development margin is narrowed. The reason why disconnection easily occurs is that organic components in the conductive pattern are not sufficiently cured, and thus very small defects such as a partial loss of conductive particles during development are easily generated.

The thickness of the conductive coating film on the display region after drying is preferably 0.1 to 3 μm, more preferably 0.5 to 2 μm. The thickness of the conductive coating film on the design region after drying is preferably 0.5 to 7 μm, but it is not limited thereto. When the photosensitive conductive paste is applied onto the display region and the design region at once to obtain a conductive coating film, it is preferred that the thickness on the design region is matched with a thickness appropriately selected on the display region, and the thickness after drying is preferably 0.5 to 2 μm. The thickness can be measured using a probe type step profiler such as "SURFCOM" (registered trademark) 1400 (manufactured by TOKYO SEIMIT SU CO., LTD.). More specifically, the film thickness is measured at randomly selected three positions using a probe type step profiler (measurement length: 1 mm; scanning speed: 0.3 mm/sec), and an average value thereof is defined as a thickness.

When the conductive coating film obtained in the conductive coating film formation step contains a solvent, it is preferred that the conductive coating film is dried to volatilize and remove the solvent. Examples of the method of drying the conductive coating film include heating/drying by an oven or a hot plate, heating/drying by an electromagnetic wave from an electromagnetic ultraviolet lamp, an infrared heater or a halogen heater, or by a microwave, and vacuum drying. The heating temperature is preferably 50 to 150° C., more preferably 80 to 110° C. The solvent remains when the heating temperature is lower than 50° C. On the other hand, when the heating temperature is higher than 150° C., the conductive coating film is heat-cured so that a pattern cannot be formed by exposure. The heating temperature is preferably 1 minute to several hours, more preferably 1 to 20 minutes.

In the conductive pattern formation step, the conductive coating film obtained in the conductive coating film formation step is processed by photolithography. Specifically, in the conductive pattern formation step, the conductive coating film on the display region and the conductive coating film on the design region are exposed and developed at once, and heated at 100 to 250° C., or irradiated with light from a xenon flash tube to form a conductive pattern. By forming the conductive pattern at once, disconnection and poor conduction can be inhibited to improve the conductive connectivity of the conductive pattern on each of the display region and the design region, leading to improvement of productivity.

Preferably, light for exposure, i.e. exposing light has a spectrum in an ultraviolet region corresponding to the absorption spectrum of the photosensitive organic component or photopolymerization initiator, i.e. a wavelength region of 300 to 450 nm. Examples of the light source to obtain such exposing light include a mercury lamp, a xenon lamp, a LED lamp, a semiconductor laser, a KrF excimer laser and an ArF excimer laser, and the light source is preferably the i ray (365 nm), h ray (405 nm) or gray (436 nm) of a mercury lamp. The exposing light may be light from a xenon flash tube.

Examples of the exposure method include mask exposure, and laser exposure such as a laser direct drawing method.

The exposed conductive coating films on the display region and on the design region are developed at once using a developer, and an unexposed part on each region is removed to obtain a desired pattern. Examples of the developer to be used for alkali development include aqueous solutions of tetramethyl ammonium hydroxide, diethanolamine, diethyl aminoethanol, sodium hydroxide, potassium hydroxide, sodium carbonate, potassium carbonate, triethylamine, diethylamine, methyl amine, dimethyl amine, dimethyl aminoethyl acetate, dimethyl aminoethanol, dimethyl aminoethyl methacrylate, cyclohexylamine, ethylenediamine, and hexamethylenediamine, and to these aqueous solutions may be added a polar solvent such as N-methyl-2-pyrrolidone, N,N-dimethylformamide, N,N-dimethyl acetamide, dimethylsulfoxide, and γ-butyrolactone, an alcohol such as methanol, ethanol, and isopropanol, an ester such as ethyl lactate and propylene glycol monomethyl ether acetate, a ketone such as cyclopentanone, cyclohexanone, isobutyl ketone, and methyl isobutyl ketone, or a surfactant. Examples of the developer to be used for organic development include polar solvents such as N-methyl-2-pyrrolidone, N-acetyl-2-pyrrolidone, N,N-dimethylacetamide, N,N-dimethylformamide, dimethyl sulfoxide, and hexamethylphosphortriamide, and mixed solutions of these polar solvents and methanol, ethanol, isopropyl alcohol, xylene, water, methyl carbitol or ethyl carbitol.

Examples of the development method include a method in which a developer is sprayed onto the surface of a conductive coating film while a substrate is left at rest or rotated, a method in which a substrate is immersed in a developer, and a method in which a substrate is immersed in a developer while an ultrasonic wave is applied thereto.

The pattern obtained by development may be subjected to a rinsing treatment with a rinsing liquid. Examples of the rinsing liquid include water, and aqueous solutions obtained by adding to water an alcohol such as ethanol and isopropyl alcohol, or an ester such as ethyl lactate and propylene glycol monomethyl ether acetate.

The pattern obtained by development is further heated at 100 to 250° C., or irradiated with light from a xenon flash tube to obtain a conductive pattern.

Examples of the method of heating the pattern include heating/drying by an oven, an inert oven, a hot plate, an infrared ray or the like and vacuum drying. Heating increases the hardness of the resulting conductive pattern so that chipping, detachment or the like due to contact with other members can be inhibited and, further, adhesion with the substrate can be improved.

The pattern may be pulse-irradiated with light from a xenon flash tube. The pulse irradiation refers to a light irradiation method in which continuous irradiation and intermittent irradiation are repeated instantaneously. Pulse irradiation is preferred because light irradiation which is less intense compared to continuous irradiation is possible so that rapid denaturation of a conductive pattern can be suppressed. Pulse irradiation is an effective method of improving production efficiency, prevention of excessive light scattering, prevention of damage to a substrate and so on. More specifically, it is practical to combine pulse irradiation in a total irradiation time of 0.01 to 10000 msec. Light having a bright line may be applied along with light from a xenon flash tube. To simultaneously apply light having a bright line, for example, a mercury xenon lamp may be used, or light from a xenon lamp and light from a mercury lamp may be applied simultaneously.

The energy amount of light to be applied from a xenon flash tube may be appropriately determined according to the type of the substrate or the thickness and line width of a conductive pattern to be formed, but it is preferably 300 to 2500 mJ/cm$^2$ to prevent damage to a substrate that is easily degraded. The energy amount and irradiation time of light to be applied from a xenon flash tube may be differentiated between on the display region and on the design region.

On the other hand, as a process of ensuring that the resulting pattern exhibits conductivity, heating at 100 to 250° C. may be performed in combination with irradiation of light from a xenon flash tube.

The line width of the formed conductive pattern on the display region should be 2 to 6 μm. When the line width of the conductive pattern is less than 2 μm, disconnection occurs due to physical stimulation in subsequent steps or adhesion with the substrate is deteriorated. The line width should be 6 μm or less so that it cannot be visually recognized. Specifically, when the conductive pattern is used in a small display such as that of a smart phone including a touch panel, e.g., a display having a size of around 6 inches, the viewpoint distance decreases, and therefore the line width is preferably narrow and should be 6 μm or less. When the conductive pattern is applied to a large screen such as a display screen having a size exceeding several tens of inches, the viewpoint distance increases, and therefore the upper limit of the line width of the conductive pattern can be finely adjusted in a visually unrecognizable range only to a limited extent.

Preferably, the conductive pattern on the display region is in the form of a mesh pattern having intersections. The form of a mesh pattern is preferably a form distinguishable on coordinates in which patterns having, for example, a tetragonal shape or a diamond shape are repeated. In the mesh pattern, the pattern pitch between the end points of a conductive pattern on a side and a conductive pattern on the adjacent side is preferably 100 to 3000 μm. When the pattern pitch is in this range, the pattern is transparent to the extent that it cannot be visually recognized, and thus deterioration, i.e. cloudiness of the appearance can be prevented. A pattern pitch of less than 100 μm is not appropriate because transparency is deteriorated or a short-circuit defect between patterns easily occurs.

The line width of the formed conductive pattern on the design region should be 7 to 100 μm. As the conductive pattern on the design region, a form is well known in which a plurality of patterns are regularly arranged in parallel. In this case, the pitch of the conductive pattern on the design region is preferably 14 to 200 μm. The design region is disposed on the frame of a display, and when it is desired to narrow the frame to widen the display region of the display, the line width should be 7 to 100 μm. In this case, the pattern pitch may be decreased, but when the pattern pitch is decreased, residuals easily remain between wiring lines to cause a short-circuit, and therefore it is preferred to increase the pattern pitch where possible. The pattern pitch for a narrow frame is preferably 14 to 200 μm. When production stability is pursued, it is preferred to form the conductive pattern with a line width of 10 to 100 μm and a pattern pitch of 20 to 200 μm.

Examples of the method of forming a conductive pattern with different line widths on the display region and on the design region include a method in which the opening width of an exposure mask to be used is made optimum, a method in which there is provided a difference in exposure amount between on the display region and on the design region, and a method in which after exposure is performed at once, a part of an exposure mask, corresponding to the design region is masked, and only the display region is then further exposed.

A method of producing a touch sensor member in a second aspect includes: a lightproof coating film formation step of obtaining, in a substrate sectioned into a display region and a design region, a lightproof coating film by applying a photosensitive lightproof paste onto the display region; a conductive coating film formation step of obtaining a conductive coating film by applying a photosensitive conductive paste onto the display region and the design region after the lightproof coating film formation step; and a conductive pattern formation step of obtaining a conductive pattern by exposing and developing the lightproof coating film and the conductive coating film on the display region and the conductive coating film on the design region at once and then by heating the films at 100 to 250° C. or by irradiating same with light from a xenon flash tube, wherein the line width of the conductive pattern on the display region is 2 to 6 μm, and the line width of the conductive pattern on the design region is 7 to 100 μm.

According to the second aspect, reflection of light by the conductive pattern on the display region can be inhibited due to existence of the lightproof film, thus being preferred.

The method of obtaining a lightproof coating film by applying a photosensitive lightproof paste onto the display region of the substrate may be one similar to the method of obtaining a conductive coating film. In other words, the lightproof coating film can be provided with a pattern similar to the conductive pattern on the display region.

The photosensitive lightproof paste to be applied onto the display region of the substrate refers to a composition containing a pigment, a photosensitive organic compound as an organic component, and a solvent. The ratio of the pigment to the total solid content in the photosensitive lightproof paste is preferably 5 to 50% by mass. When the added amount of the pigment based on the total solid content is 5% by mass or more, a lightproof coating film which is dense and has high lightproofness can be obtained. On the other hand, when the added amount of the pigment based on the total solid content is more than 50% by mass, not only exposing light does not smoothly pass through the lightproof coating film, and thus it is difficult to form a minute pattern, but also the pattern is easily detached in development.

The pigment contained in the photosensitive lightproof paste refers to a colored powder having absorption in a visible region. The pigment is preferably an inorganic compound powder because the color, particle size, dispersion state, surface roughness and so on of the powder, which have influences on lightproofness, are easily controlled. The inorganic compound refers to compounds composed of elements other than carbon and some simple carbon compounds. Examples of some simple carbon compounds include allotropes of carbon such as graphite and diamond, and salts such as metal carbonates such as calcium carbonate, and metal carbides.

Examples of the inorganic compound as a pigment include metal oxides, carbon black, acetylene black, ketjen black, titanium black, carbon whiskers and carbon nanotubes, and a powder of an oxide of a metal selected from the group consisting of chromium, iron, cobalt, ruthenium, manganese, palladium, copper, nickel, magnesium and titanium, or carbon black is preferred. The metal oxides or carbon black may be used not only alone but also in the form of an alloy or a mixed powder. Examples of the pigment include tricobalt tetraoxide ($Co_3O_4$), $Cr_2O_3$—$CuO$—$Co_3O_4$, ruthenium oxide ($RuO_2$) and $CuO$—$Cr_2O_3$—$Mn_2O_3$. The metal oxide which is covered with another metal powder or a resin powder may be used.

The volume average particle size of the pigment is preferably 0.05 to 2 μm, more preferably 0.05 to 1 μm for achieving a minute pattern while securing lightproofness by uniformly dispersing the pigment in the paste. Lightproofness is insufficient when the volume average particle size of the pigment is less than 0.05 μm. On the other hand, when the volume average particle size of the pigment is more than 2 μm, the smoothness of the surface of the lightproof coating film is reduced and, further, exposing light does not smoothly pass through the lightproof coating film, and thus it is difficult to form a minute pattern. The volume average particle size of the pigment can be measured by a dynamic light scattering method as in conductive particles.

Like the photosensitive organic compound contained in the photosensitive conductive paste, the photosensitive organic compound contained in the photosensitive lightproof paste refers to a monomer, oligomer or polymer containing an unsaturated double bond.

Like the thermosetting compound contained in the photosensitive conductive paste, the thermosetting compound which may be contained in the photosensitive lightproof paste refers to a monomer, oligomer or polymer having an epoxy group, a phenol resin, a polyimide precursor or a ring-closed polyimide, and a monomer, oligomer or polymer having an epoxy group is preferred. The added amount of the thermosetting compound is preferably similar to the added amount of the thermosetting compound in the photosensitive conductive paste. The photosensitive organic compound and the thermosetting compound have preferably a cycloaliphatic structure, more preferably a cyclohexane backbone to retain the shape of a conductive coating film during heating or irradiation of light from a xenon flash tube.

It is preferred that like the photosensitive conductive paste, the photosensitive lightproof paste contains a photopolymerization initiator as necessary. The added amount of the photopolymerization initiator is preferably similar to the added amount of the photopolymerization initiator in the photosensitive conductive paste. The photosensitive lightproof paste may contain a sensitizer along with the photopolymerization initiator. The added amount of the sensitizer is also preferably similar to the added amount of the sensitizer in the photosensitive conductive paste.

Like the photosensitive conductive paste, the photosensitive lightproof paste may contain a carboxylic acid or an acid anhydride thereof. The added amount of the carboxylic acid or acid anhydride thereof is preferably similar to the added amount of the carboxylic acid or acid anhydride thereof in the photosensitive conductive paste.

Like the photosensitive conductive paste, the photosensitive lightproof paste contains a solvent to adjust the viscosity of the photosensitive lightproof paste.

Like the photosensitive conductive paste, the photosensitive lightproof paste may contain a plasticizer, a leveling agent, a surfactant, a silane coupling agent, an antifoaming agent, a stabilizer and so on as long as desired properties of the photosensitive lightproof paste are not impaired.

When the photosensitive lightproof paste is applied by screen printing, the viscosity thereof is preferably 5,000 to 150,000 mPa·s. When the photosensitive lightproof paste is applied by spin coating using a spinner, the viscosity thereof is preferably 10 to 10,000 mPa·s. When photosensitive lightproof paste is applied by a die coater, the viscosity thereof is preferably 50 to 50,000 mPa·s. The viscosity of the photosensitive lightproof paste can be measured at 3 rpm using a Brookfield viscometer as in the photosensitive conductive paste.

In the method of producing a touch sensor member in the second aspect, a lightproof coating film is obtained by applying a photosensitive lightproof paste onto the display region of the substrate in the lightproof coating film formation step, and in the subsequent conductive coating film formation step, the same procedure as in the conductive coating film formation step in the production method in the first aspect is carried out except that a conductive coating film is obtained by applying a photosensitive conductive paste onto the lightproof coating film. In the lightproof layer and conductive pattern formation step, the same procedure as in the conductive pattern formation step in the production method in the first aspect is carried out except that a lightproof layer is obtained from the lightproof coating film. The conductive pattern formed on the display region of the substrate has a laminated structure of a lightproof layer derived from the lightproof coating film and a conductive pattern derived from the conductive coating film.

The lightproof coating film is not required to be formed over the entire surface of the display region, and may be formed on only a part of the display region. As necessary, a lightproof coating film may also be formed on the design region of the substrate to form a laminated structure of a lightproof layer and a conductive pattern on the design region of the substrate.

In the conductive coating film formation step in the method of producing a touch sensor member, it is preferred to coat the display region and the design region with the same photosensitive conductive paste at once for simplification of the production process. On the other hand, the photosensitive conductive paste to be applied onto the display region and the photosensitive conductive paste to be applied onto the design region may be made different from each other as necessary. The volume average particle size of conductive particles contained in the photosensitive conductive paste to be applied onto the display region and the volume average particle size of conductive particles contained in the photosensitive conductive paste to be applied onto the design region may be made different from each other and, in this case, the former is preferably 0.05 to 0.5 µm, and the latter is preferably 0.5 to 3 µm.

On the other hand, when different photosensitive conductive pastes are used, it is preferred that the photosensitive organic compounds and thermosetting compounds, particularly the thermosetting compounds, contained in the photosensitive conductive pastes have similar structures, it is more preferred that the thermosetting compounds contained in the photosensitive conductive pastes have substantially the same composition, and it is further preferred that the photosensitive organic compounds and thermosetting compounds contained in the photosensitive conductive pastes have substantially the same composition. When compounds common to the photosensitive conductive pastes are selected as the photosensitive organic compound and the thermosetting compound, respectively, affinity at the boundary between the conductive pattern formed on the display region and the conductive pattern formed on the design region are improved and, further, problems that arise from a difference in shrinkage factor in heating or irradiation of light from a xenon flash tube in the conductive pattern formation step are eliminated.

It is further preferred that the conductive coating film on the display region and the conductive coating film on the design region have the same composition to further improve affinity at the boundary as described above, and completely inhibit problems that arise from a difference in shrinkage factor in heating or irradiation of light from a xenon flash tube. When the compositions of both the conductive coating films are the same, it is not necessary to use different photosensitive conductive pastes, and thus a photosensitive conductive paste can be applied onto the display region and the design region at once so that the simplicity of the production process can be improved as described above.

The photosensitive conductive paste and the photosensitive lightproof paste to be used in the production method can be produced using, for example, a disperser or a kneader such as a three-roll mill, a ball mill, and a planetary ball mill.

The touch sensor member is a touch sensor member including: a substrate sectioned into a display region and a design region; a conductive pattern formed on the display region and having a line width of 2 to 6 µm; and a conductive pattern formed on the design region and having a line width of 7 to 100 µm, wherein the conductive pattern having a line width of 2 to 6 µm and the conductive pattern having a line width of 7 to 100 µm have the same composition. The touch sensor member may include a lightproof layer between the display region and the conductive pattern having a line width of 2 to 6 µm. The touch sensor member can be obtained by the method of producing a touch sensor member.

The touch sensor member produced by the production method is suitably used as a detection electrode and its peripheral conductive wiring provided in a touch sensor. Examples of the type of a touch panel include a resistive film type, an optical type, an electromagnetic induction type, and an electrostatic capacitance type, and the touch sensor member produced by the production method is more suitably used in the electrostatic capacitance type touch panel.

EXAMPLES

Our sensor members and methods will be described below more in detail by way of examples, but this disclosure is not limited to these examples.

Materials used in examples are as follows.
Photosensitive Organic Compound

Synthesis Example 1: Photosensitive Organic Compound (1)

Copolymerization ratio (mass basis): ethyl acrylate (hereinafter, referred to as "EA")/2-ethylhexyl methacrylate (hereinafter, referred to as "2-EHMA")/styrene (hereinafter, referred to as "St")/glycidyl methacrylate (hereinafter, referred to as "GMA")/acrylic acid (hereinafter, referred to as "AA")=20/40/20/5/15

In a reaction vessel in a nitrogen atmosphere, 150 g of DMEA was added, and the temperature was elevated to 80° C. using an oil bath. To this was added dropwise for 1 hour a mixture including 20 g of EA, 40 g of 2-EHMA, 20 g of St, 15 g of AA, 0.8 g of 2,2'-azobisisobutyronitrile and 10 g of diethylene glycol monoethyl ether acetate. After completion of the dropwise addition, a further polymerization reaction was carried out for 6 hours. Thereafter, 1 g of hydroquinone monomethyl ether was added to stop the polymerization reaction. Subsequently, a mixture including 5 g of GMA, 1 g of triethyl benzyl ammonium chloride and 10 g of DMEA was added dropwise for 0.5 hours. After completion of the dropwise addition, a further addition reaction was carried out for 2 hours. The obtained reaction solution was refined with methanol to remove unreacted impurities, and dried under vacuum for 24 hours to obtain a photosensitive organic compound (1). The acid value of the obtained photosensitive organic compound (1) was 103 mg KOH/g.

Synthesis Example 2: Photosensitive Organic Compound (2)

Copolymerization ratio (mass basis) tricyclodecane dimethanol diacrylate (IRR214-K; manufactured by DAICEL- CYTEC Co., Ltd.)/modified bisphenol A diacrylate (EBE-CRYL150; DAICEL-CYTEC Co., Ltd.)/St/AA=25/40/20/15

In a reaction vessel in a nitrogen atmosphere, 150 g of DMEA was added and the temperature was elevated to 80° C. using an oil bath. To this was added dropwise for 1 hour a mixture including 25 g of IRR214-K, 40 g of EBE-CRYL150, 20 g of St, 15 g of AA, 0.8 g of 2,2'-azobisisobutyronitrile and 10 g of DMEA. After completion of the dropwise addition, a further polymerization reaction was carried out for 6 hours. Thereafter, 1 g of hydroquinone monomethyl ether was added to stop the polymerization reaction. The obtained reaction solution was refined with methanol to remove unreacted impurities, and dried under vacuum for 24 hours to obtain a photosensitive organic compound (2). The acid value of the obtained photosensitive organic compound (2) was 89 mg KOH/g.

Thermosetting Compound

Epoxy resin (1) (ADEKA RESIN EP-4530 (epoxy equivalent: 190); manufactured by ADEKA CORPORATION)

Epoxy resin (2) JER1001 (epoxy equivalent: 475); manufactured by Mitsubishi Chemical Corporation)

Phenol resin (PSF-2808; manufactured by Gun Ei Chemical Industry Co., Ltd.) Monomer LIGHT ACRYLATE BP-4EA (manufactured by KYOEISHA CHEMICAL Co., Ltd.)

LIGHT ACRYLATE TMP-A (manufactured by KYOEISHA CHEMICAL Co., Ltd.) Pigment $Co_3O_4$ particles (manufactured by SEIDO CHEMICAL INDUSTRY CO., LTD.) Conductive Particles Ag particles having a volume average particle size of 1 µm Ag particles having a volume average particle size of 0.3 µm Ag particles having a volume average particle size of 0.05 µm Photopolymerization Initiator N-1919 (manufactured by ADEKA CORPORATION) Solvent Diethylene glycol monoethyl ether acetate: DMEA (manufactured by Tokyo Chemical Industry Co., Ltd.)

Design Black Ink

MRX-HF (manufactured by Teikoku Printing Inks Mfg. Co., Ltd.)

Photosensitive conductive pastes and a photosensitive lightproof paste were prepared in the following manner.

Photosensitive Conductive Paste A

In a 100 mL clean bottle, 17.5 g of the photosensitive organic compound (2), 0.5 g of N-1919, 1.5 g of the epoxy resin (1) and 3.5 g of LIGHT ACRYLATE BP-4EA (manufactured by KYOEISHA CHEMICAL Co., Ltd.) and 19.0 g of DMEA were added and mixed by "AWATORI RENTARO" (registered trademark) (ARE-310; manufactured by THINKY CORPORATION) to obtain 42.0 g of a resin solution. The obtained resin solution in an amount of 42.0 g and 62.3 g of Ag particles having a volume average particle size of 0.3 µm were mixed together, and kneaded using a three-roll mill (EXAKT M-50; manufactured by EXAKT), 7 g of DMEA was then added, and the mixture was mixed to obtain 111 g of a photosensitive conductive paste A. The viscosity of the photosensitive conductive paste A was 10,000 mPa·s.

Photosensitive Conductive Paste B

Except that the Ag particles were changed to the Ag particles having a volume average particle size of 1 µm, and the epoxy resin was changed to the epoxy resin (2), the same method as in the photosensitive conductive paste A was used to obtain 111 g of a photosensitive conductive paste B. The viscosity of the photosensitive conductive paste B was 13,000 mPa·s.

Photosensitive Conductive Paste C

Except that the epoxy resin (1) was changed to a phenol resin, the same method as in the photosensitive conductive paste B was used to obtain 111 g of a photosensitive conductive paste C. The viscosity of the photosensitive conductive paste C was 20,000 mPa·s.

Photosensitive Conductive Paste D

Except that the Ag particles were changed to the Ag particles having a volume average particle size of 0.05 µm, and the epoxy resin was changed to LIGHT ACRYLATE TMP-A, the same method as in the photosensitive conductive paste A was used to obtain 111 g of a photosensitive conductive paste D. The viscosity of the photosensitive conductive paste D was 6,000 mPa·s.

Photosensitive Lightproof Paste

In a 100 mL clean bottle, 10.0 g of the photosensitive organic compound (1), 0.5 g of N-1919, 1.0 g of the epoxy resin (2) and 10.0 g of DMEA were added and mixed by "AWATORI RENTARO" (registered trademark) (ARE-310; manufactured by THINKY CORPORATION) to obtain 21.5 g of a resin solution. The obtained resin solution in an amount of 21.5 g and 2.0 g of $Co_3O_4$ particles having a volume average particle size of 0.8 µm were mixed together, and kneaded using a three-roll mill (EXAKT M-50; manufactured by EXAKT) to obtain 23.5 g of a photosensitive lightproof paste. The viscosity of the photosensitive lightproof paste was 12,000 mPa·s.

Example 1

A design black ink was applied onto a design region of a glass substrate beforehand by screen printing and heated in an IR (far infrared) heater furnace at 150° C. for 1 hour to form a design layer. The photosensitive conductive paste A was applied onto a display region and the design region of the glass substrate by screen printing such that the thickness after drying would be 1.5 µm, thereby obtaining a conductive coating film. The obtained conductive coating film was dried in an IR heater furnace at 90° C. for 10 minutes. Next, the conductive coating film was exposed at an exposure amount of 500 mJ/cm$^2$ (in terms of a wavelength of 365 nm) by exposure equipment (PEM-6M; manufactured by UNION OPTICAL CO., LTD.) through a mesh-shaped exposure mask having a pitch of 140 µm with an opening width of 3 µm at a part corresponding to the display region and an opening width of 20 µm at a part corresponding to the design region, subjected to immersion development with a 0.2 mass % $Na_2CO_3$ solution for 30 seconds, rinsed with ultrapure water, and then heated in an IR heater furnace at 140° C. for 30 minutes to obtain a conductive pattern.

For the obtained conductive pattern, patterning performance and conductivity were evaluated in the following manner. The evaluation results are shown in Table 1.

Method of Evaluating Patterning Performance

The obtained conductive pattern was observed with an optical microscope, and the pattern thickening line width and pattern straightness were evaluated. For pattern thickening, it is preferred that the line width of the conductive pattern formed on the display region is 2 to 6 µm, and the line width of the conductive pattern formed on the design region is 7 to 25 µm. When the line width of the conductive pattern on the display region is less than 2 µm, the sample is rated as "Bad" because disconnection easily occurs in subsequent steps. For pattern straightness, a sample in the conductive pattern of which either meander or disconnection in visual inspection was not observed was rated as "Good," a sample in the conductive pattern of which one of meandering and disconnection was observed was rated as "Fair," and a sample in the conductive pattern of which both meandering and disconnection were observed was rated as "Bad."

Method of Evaluating Conductivity

A terminal of a resistance measuring tester (2407A; manufactured by BK Precision) was connected between the end points of the obtained conductive pattern to evaluate conductivity. The length between the end points was set to 2 cm. A sample having a resistance value of less than 1000Ω was rated as "Good," a sample having a resistance value of 1000 to 2000Ω was rated as "Fair," and a sample for which it was unable to measure the resistance value was rated as "Bad."

Method of Evaluating Light Reflection

The L* value was determined by measuring the obtained conductive pattern on the display region from the back side of the substrate using a spectral colorimeter (CM-2500d; manufactured by KONICA MINOLTA, INC.). A sample having a L* value of less than 36 was rated as "Good," a sample having a L* value of not less than 36 and not more than 60 was rated as "Fair," and a sample having a L* value of more than 60 was rated as "Bad." L* is an index of brightness, and when L* is 100, it indicates pure white, and when L* is 0, it indicates black.

Method of Evaluating Visibility

The substrate with the obtained conductive pattern on the display region was placed at a distance of 30 cm to 50 cm from the eyes, and visually observed under a white light for 30 seconds. Ten persons were provided as observers. A sample whose conductive pattern could not be confirmed by all ten persons in 30 seconds was rated as "Good," a sample whose conductive pattern could not be confirmed by five or more persons was rated as "Fair," and a sample whose conductive pattern could be confirmed by all ten persons was rated as "Bad."

Example 2

The same procedure as in Example 1 was carried out to form a design layer on a design region of a glass substrate. The photosensitive lightproof paste B was applied onto a display region of the glass substrate by screen printing such that the thickness after drying would be 2 μm, thereby obtaining a lightproof coating film. The obtained lightproof coating film was dried in an IR heater furnace at 90° C. for 10 minutes. Further, the photosensitive conductive paste B was applied onto the lightproof coating film and the design region by screen printing such that the thickness after drying would be 2 μm, thereby obtaining a conductive coating film. The obtained conductive coating film was dried in an IR furnace at 90° C. for 5 minutes.

Next, the conductive coating film was exposed at an exposure amount of 800 mJ/cm$^2$ (in terms of a wavelength of 365 nm) by exposure equipment through an exposure mask identical to that in Example 1, subjected to immersion development with a 0.2 mass % $Na_2CO_3$ solution for 30 seconds, rinsed with ultrapure water, and then heated in an IR heater furnace at 140° C. for 30 minutes to obtain a conductive pattern. For the obtained conductive pattern, the same evaluations as in Example 1 were performed. The evaluation results are shown in Table 1.

Example 3

Except that the photosensitive conductive paste A was used, the same procedure as in Example 2 was carried out to obtain a lightproof coating film and a conductive coating film.

Next, the conductive coating film was exposed at an exposure amount of 300 mJ/cm$^2$ by exposure equipment through an exposure mask identical to that in Example 1, a part of the exposure mask, which corresponded to the design region, was masked, and only the display region was additionally exposed at an exposure amount of 700 mJ/cm$^2$. The conductive coating film was subjected to immersion development with a 0.2 mass % $Na_2CO_3$ solution for 30 seconds, rinsed with ultrapure water, and then heated in an IR heater furnace at 140° C. for 30 minutes to obtain a conductive pattern. For the obtained conductive pattern, the same evaluations as in Example 1 were performed. The evaluation results are shown in Table 1.

Example 4

A design layer was formed on a design region of a glass substrate. The photosensitive conductive paste B and the photosensitive conductive paste A were applied onto the design region and a display region, respectively, of the glass substrate by screen printing such that the thickness after drying would be 2 μm for each of the pastes, thereby obtaining a conductive coating film. The obtained conductive coating film was dried, exposed, developed, rinsed and heated by the same method as in Example 1 to obtain a conductive pattern. For the obtained conductive pattern, the same evaluations as in Example 1 were performed. The evaluation results are shown in Table 1.

Example 5

Except that the photosensitive conductive paste D was applied by a die coater such that the thickness after drying would be 1 μm or less, the same procedure as in Example 1 was carried out to obtain a conductive coating film. A conductive pattern was obtained by drying, exposing, developing and rinsing the obtained conductive coating film by the same method as in Example 1 except that the opening width at a part corresponding to the display region was changed to 2 μm, and the heating temperature was changed to 180° C. For the obtained conductive pattern, the same evaluations as in Example 1 were performed. The evaluation results are shown in Table 1.

Example 6

Except that a PET film substrate was used in place of the glass substrate, and the photosensitive conductive paste C was used in place of the photosensitive conductive paste A, the same procedure as in Example 4 was carried out to obtain a conductive pattern. For the obtained conductive pattern, the same evaluations as in Example 1 were performed. The evaluation results are shown in Table 1.

Example 7

Except that the photosensitive conductive paste A was applied onto the design region, the same procedure as in Example 2 was carried out to obtain a lightproof coating film and a conductive coating film.

Next, the conductive coating film was exposed at an exposure amount of 300 mJ/cm$^2$ by exposure equipment through an exposure mask identical to that in Example 1, a part of the exposure mask, which corresponded to the design region, was masked, and only the display region was additionally exposed at an exposure amount of 700 mJ/cm$^2$. The conductive coating film was subjected to immersion development with a 0.2 mass % Na$_2$CO$_3$ solution for 30 seconds, rinsed with ultrapure water, and then irradiated with light from a xenon flash tube under the conditions of an energy amount of 0.5 J/cm$^2$ and an irradiation time of 0.3 msec to obtain a conductive pattern. For the obtained conductive pattern, the same evaluations as in Example 1 were performed. The evaluation results are shown in Table 1.

Example 8

A PET film substrate was used in place of the glass substrate, and the photosensitive conductive paste C was used in place of the photosensitive conductive paste A. The conductive coating film was dried, exposed, developed and rinsed by the same method as in Example 4, and then irradiated with light from a xenon flash tube under the conditions of an energy amount of 1.0 J/cm$^2$ and an irradiation time of 0.3 msec to obtain a conductive pattern. For the obtained conductive pattern, the same evaluations as in Example 1 were performed. The evaluation results are shown in Table 1.

The conductive patterns in Examples 1 to 8 were each free from disconnection and excellent in straightness, and thus suitable as a touch sensor member.

INDUSTRIAL APPLICABILITY

The production method can be suitably used to form a conductive pattern serving as a detection electrode and conductive wiring provided in a touch sensor member.

The invention claimed is:

1. A method of producing a touch sensor member, comprising:
 a conductive coating film formation step of obtaining, in a substrate sectioned into a display region and a design region comprising a frame portion in the touch sensor member, a conductive coating film by applying a photosensitive conductive paste onto the display region and the design region; and
 a conductive pattern formation step of obtaining a conductive pattern comprising a multiplicity of lines by (1) simultaneously exposing the conductive coating film on the display region and the conductive coating film on the design region and (2) simultaneously developing the conductive coating film on the display region and the conductive coating film on the design region, and, (3) thereafter, heating the films at 100 to 250° C. or irradiating same with light from a xenon flash tube, wherein
 line width of the lines in the conductive pattern on the display region is 2 to 6 μm, and
 line width of the lines in the conductive pattern on the design region is 7 to 100 μm.

2. A method of producing a touch sensor member, comprising:
 a lightproof coating film formation step of obtaining, in a substrate sectioned into a display region and a design

TABLE 1

| | | Display region | | Design region | |
|---|---|---|---|---|---|
| | Substrate | Photosensitive conductive paste | Photosensitive lightproof paste | Photosensitive conductive paste | Photosensitive lightproof paste |
| Example 1 | Glass | A | None | A | None |
| Example 2 | Glass | B | Present | B | None |
| Example 3 | Glass | A | Present | A | None |
| Example 4 | Glass | B | None | A | None |
| Example 5 | Glass | D | None | D | None |
| Example 6 | PET film | C | None | A | None |
| Example 7 | PET film | B | Present | A | None |
| Example 8 | PET film | C | None | A | None |

| | Properties | | | | | |
|---|---|---|---|---|---|---|
| | Pattern performance | | | | | |
| | Pattern thickening line width (μm) | | | | Light | |
| | Display region | Design region | Disconnection/straightness Evaluation | Conductibility Evaluation | reflection Evaluation | Visibility Evaluation |
| Example 1 | 4 | 21 | Good | Good | Fair | Good |
| Example 2 | 6 | 25 | Good | Good | Good | Fair |
| Example 3 | 5 | 22 | Good | Good | Good | Fair |
| Example 4 | 5 | 21 | Good | Good | Fair | Fair |
| Example 5 | 3 | 20 | Good | Fair | Fair | Good |
| Example 6 | 6 | 21 | Fair | Good | Fair | Fair |
| Example 7 | 4 | 22 | Fair | Good | Good | Good |
| Example 8 | 6 | 21 | Fair | Fair | Fair | Fair | region comprising a frame portion in the touch sensor member, by applying a photosensitive lightproof paste onto the display region;

a conductive coating film formation step of obtaining a conductive coating film by applying a photosensitive conductive paste onto the display region and the design region after the lightproof coating film formation step; and a lightproof layer and conductive pattern formation step of obtaining a lightproof layer and a conductive pattern comprising a multiplicity of lines by (1) simultaneously exposing the lightproof coating film and the conductive coating film on the display region and the conductive coating film on the design region and (2) simultaneously developing the lightproof coating film and the conductive coating film on the display region and the conductive coating film on the design region, and (3) thereafter heating the films at 100 to 250° C. or irradiating same with light from a xenon flash tube, wherein a line width of the lines in the conductive pattern on the display region is 2 to 6 μm, and a line width of the lines in the conductive pattern on the design region is 7 to 100 μm.

3. The method according to claim 1, wherein the conductive coating film on the display region and the conductive coating film on the design region contain the same thermosetting compound.

4. The method according to claim 1, wherein the conductive coating film on the display region and the conductive coating film on the design region have the same composition.

5. The method according to claim 4, wherein, in the conductive coating film formation step, a photosensitive conductive paste is applied onto the display region and the design region at once.

6. The method according to claim 2, wherein the conductive coating film on the display region and the conductive coating film on the design region contain the same thermosetting compound.

7. The method according to claim 2, wherein the conductive coating film on the display region and the conductive coating film on the design region have the same composition.

8. The method according to claim 3, wherein the conductive coating film on the display region and the conductive coating film on the design region have the same composition.

* * * * *